(12) United States Patent
Huang et al.

(10) Patent No.: US 9,627,524 B2
(45) Date of Patent: Apr. 18, 2017

(54) HIGH VOLTAGE METAL OXIDE SEMICONDUCTOR DEVICE AND METHOD FOR MAKING SAME

(75) Inventors: Tsung-Yi Huang, Hsinchu (TW); Huan-Ping Chu, Hsinchu (TW); Ching-Yao Yang, Zhubei (TW); Hung-Der Su, Zhudong Township, Hsinchu County (TW)

(73) Assignee: RICHTEK TECHNOLOGY CORPORATION, R.O.C., Chupei, Hsinchu (TW)

( * ) Notice: Subject to any disclaimer, the term of this patent is extended or adjusted under 35 U.S.C. 154(b) by 572 days.

(21) Appl. No.: 12/715,501

(22) Filed: Mar. 2, 2010

(65) Prior Publication Data

US 2011/0215403 A1 Sep. 8, 2011

(51) Int. Cl.
*H01L 29/66* (2006.01)
*H01L 29/78* (2006.01)

(52) U.S. Cl.
CPC .................................... *H01L 29/78* (2013.01)

(58) Field of Classification Search
CPC ............. H01L 29/7835; H01L 29/1095; H01L 29/6659; H01L 29/78; H01L 29/7801
USPC .................. 257/336, 335, E21.345
See application file for complete search history.

(56) References Cited

U.S. PATENT DOCUMENTS

| 4,811,075 | A | * | 3/1989 | Eklund | 257/369 |
| 5,426,063 | A | * | 6/1995 | Kaneko | H01L 21/26586 257/E21.345 |
| 5,744,994 | A | * | 4/1998 | Williams | 327/374 |
| 5,801,416 | A | * | 9/1998 | Choi | H01L 21/28185 257/335 |
| 5,834,347 | A | * | 11/1998 | Fukatsu et al. | 438/232 |
| 5,976,923 | A | * | 11/1999 | Tung | 438/228 |
| 6,102,528 | A | * | 8/2000 | Burke et al. | 347/59 |
| 6,127,696 | A | * | 10/2000 | Sery et al. | 257/207 |
| 6,198,131 | B1 | * | 3/2001 | Tung | H01L 21/82385 257/335 |
| 6,297,108 | B1 | * | 10/2001 | Chu | 438/297 |
| 6,548,842 | B1 | * | 4/2003 | Bulucea et al. | 257/288 |
| 6,621,116 | B2 | * | 9/2003 | Church | 257/314 |
| 6,909,976 | B2 | * | 6/2005 | Kitamaru et al. | 702/64 |
| 6,963,109 | B2 | * | 11/2005 | Kikuchi | H01L 29/0847 257/335 |
| 7,132,717 | B2 | * | 11/2006 | Su et al. | 257/401 |
| 7,180,132 | B2 | * | 2/2007 | Cai et al. | 257/342 |
| 7,265,434 | B2 | * | 9/2007 | Williams et al. | 257/552 |
| 7,419,863 | B1 | * | 9/2008 | Bulucea | 438/199 |

(Continued)

*Primary Examiner* — Lex Malsawma
*Assistant Examiner* — Eric Jones
(74) *Attorney, Agent, or Firm* — Tung & Associates

(57) ABSTRACT

The present invention discloses a high voltage metal oxide semiconductor (HVMOS) device and a method for making same. The high voltage metal oxide semiconductor device comprises: a substrate; a gate structure on the substrate; a well in the substrate, the well defining a device region from top view; a first drift region in the well; a source in the well; a drain in the first drift region, the drain being separated from the gate structure by a part of the first drift region; and a P-type dopant region not covering all the device region, wherein the P-type dopant region is formed by implanting a P-type dopant for enhancing the breakdown voltage of the HVMOS device (for N-type HVMOS device) or reducing the ON resistance of the HVMOS device (for P-type HVMOS device).

3 Claims, 4 Drawing Sheets

(56) References Cited

U.S. PATENT DOCUMENTS

| | | | |
|---|---|---|---|
| 2002/0076869 A1* | 6/2002 | Hasegawa | 438/197 |
| 2004/0173859 A1* | 9/2004 | Hao | H01L 29/7835 |
| | | | 257/408 |
| 2006/0068542 A1* | 3/2006 | Orlowski et al. | 438/207 |
| 2006/0071278 A1* | 4/2006 | Takao | 257/365 |
| 2006/0145250 A1* | 7/2006 | Ma | 257/336 |
| 2007/0178648 A1* | 8/2007 | Huang et al. | 438/275 |
| 2008/0073675 A1* | 3/2008 | Cheng et al. | 257/272 |
| 2008/0122006 A1* | 5/2008 | Williams et al. | 257/371 |
| 2008/0182394 A1* | 7/2008 | Yang et al. | 438/510 |
| 2008/0311717 A1* | 12/2008 | Bulucea | 438/290 |

* cited by examiner

HIGH VOLTAGE METAL OXIDE SEMICONDUCTOR DEVICE AND METHOD FOR MAKING SAME

BACKGROUND OF THE INVENTION

Field of Invention

The present invention relates to a high voltage metal oxide semiconductor (HVMOS) device; particularly, it relates to an N-type HVMOS device with enhanced breakdown voltage, and a P-type HVMOS device with reduced ON resistance, by defining a P-type dopant region. The present invention also relates to a method for making a HVMOS device.

Description of Related Art

The breakdown voltage between a source and a drain of a metal oxide semiconductor device is dependant on the PN junction between the source and the drain. As an example, an avalanche breakdown occurs when the electric field in the depletion region of the PN junction is high. The breakdown voltage limits the voltage applicable to the source and drain. If the breakdown happens at the PN junction between the source and drain, the current between the source and drain will be dramatically increased, damaging the PN junction and causing failure of the MOS device.

FIG. 1 shows a conventional structure of an N-type HVMOS device, which comprises: a substrate 11, a P-type well 12a, an N-type drift region 14a, an N-type source 15a, an N-type drain 18a, an N-type lightly doped region 16a, a threshold voltage adjustment P-type dopant region 19a, and a gate structure 17. The N-type lightly doped region 16a and the N-type drift region 14a help to enhance the breakdown voltage of the N-type HVMOS device. Both regions are formed by doping lower concentration N-type impurities at the PN junctions between the heavily doped source 15a or the drain 18a and the P-type well 12a, for purpose of increasing the width of the depletion region of the PN junctions to enhance the breakdown voltage of the N-type HVMOS device.

However, as the technology trend requires even smaller device dimension and even higher voltage applied to a high-voltage device, the aforementioned prior art has encountered a bottleneck. In the aforementioned prior art, although the breakdown voltage is increased, the ON resistance, another critical parameter for the device operation, is sacrificed.

On the other hand, for a conventional P-type HVMOS device, the bottleneck problem is that if the ON resistance is reduced, the breakdown voltage is sacrificed.

In view of the foregoing, the present invention provides an N-type HVMOS device with an enhanced breakdown voltage without sacrificing the ON resistance, and a P-type HVMOS device with a reduced ON resistance without sacrificing the breakdown voltage; the present invention also provides a method for making such devices.

SUMMARY OF THE INVENTION

The first objective of the present invention is to provide an N-type HVMOS device with an enhanced breakdown voltage without sacrificing the ON resistance.

The second objective of the present invention is to provide a P-type HVMOS device with a reduced ON resistance without sacrificing the breakdown voltage.

The third objective of the present invention is to provide a method for making an HVMOS device.

To achieve the objectives mentioned above, from one perspective, the present invention provides an HVMOS device comprising: a substrate; a gate structure on the substrate; a P-type well in the substrate, which defines a device region from top view; a first N-type drift region in the P-type well; an N-type source in the P-type well; an N-type drain in the first N-type drift region, the N-type drain being separated from the gate structure by a part of the first N-type drift region; and a first P-type dopant region covering a part of a junction of the P-type well and the first N-type drift region but not covering all the device region, wherein the first P-type dopant region is formed by implanting P-type impurities for enhancing a breakdown voltage of the HVMOS device.

In one embodiment of the aforementioned HVMOS device, the first P-type dopant region has two ends from cross-section view, one end of which extends at most to the middle of the N-type drain, and the other end of which extends at least partially underneath the gate structure.

The aforementioned HVMOS device may be a symmetric or an asymmetric device. When the HVMOS device is an asymmetric device, preferably, an N-type lightly doped region partially overlapping with the N-type source and partially underneath the gate structure is provided. When the HVMOS device is a symmetric device, it is preferably provided with a second N-type drift region in the P-type well for separating the N-type source from the gate structure, and a second P-type dopant region covering a part of a junction of the P-type well and the second N-type drift region but not covering all the device region.

From another perspective, the present invention provides an HVMOS device comprising: a substrate; a gate structure on the substrate; an N-type well in the substrate, which defines a device region from top view; a first P-type drift region in the N-type well; a P-type source in the N-type well; a P-type drain in the first P-type drift region, the P-type drain being separated from the gate structure by a part of the first P-type drift region; and a first P-type dopant region covering a part of a junction of the P-type drain and the first P-type drift region but not covering all the device region, wherein the first P-type dopant region is formed by implanting a P-type dopant for reducing an ON resistance of the HVMOS device.

In one embodiment of the aforementioned HVMOS device, the first P-type dopant region has two ends from cross-section view, one end of which extends at most to a junction of the N-type well and the first P-type drift region.

The aforementioned HVMOS device may be a symmetric or an asymmetric device. When the HVMOS device is an asymmetric device, preferably, a P-type lightly doped region partially overlapping with the P-type source and partially underneath the gate structure is provided. When the HVMOS device is a symmetric device, it is preferably provided with a second P-type drift region in the N-type well for separating the P-type source from the gate structure, and a second P-type dopant region covering a part of a junction of the N-type well and the second P-type drift region but not covering all the device region, wherein the second P-type dopant region has two ends from cross-section view, one end of which extends at most to a junction of the N-type well and the second P-type drift region.

From another perspective, the present invention provides a method for making an HVMOS device, comprising: providing a substrate; forming a first conductive type well in the substrate, which defines a device region from top view; forming a second conductive type drift region in the first conductive type well; forming a gate structure on the substrate; forming a second conductive type source in the first conductive type well; forming a second conductive type drain in the drift region, the second conductive type drain being separated from the gate structure by a part of the drift region; and forming a P-type dopant region below the substrate surface by implanting a P-type dopant, for adjusting a threshold voltage of the HVMOS device, and in the meanwhile enhancing a breakdown voltage or reducing an ON resistance thereof.

In the method for making an HVMOS device, either the first conductive type is P type and the second conductive type is N type, or the first conductive type is N type and the second conductive type is P type. The step of implanting a P-type dopant is preferably performed according to parameters of: an acceleration energy from 10,000 electron volts to 200,000 electron volts; an implantation species containing boron or indium ions; and an implantation dosage from 1E12 to 1E14 ions per centimeter square.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1:
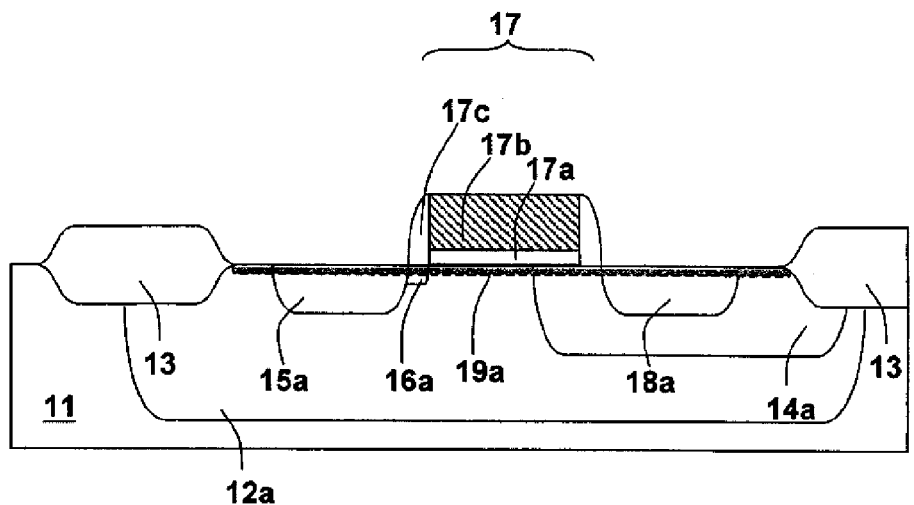
FIG. 1 illustrates a cross-section view of a prior art N-type HVMOS device.
Figure 2A:
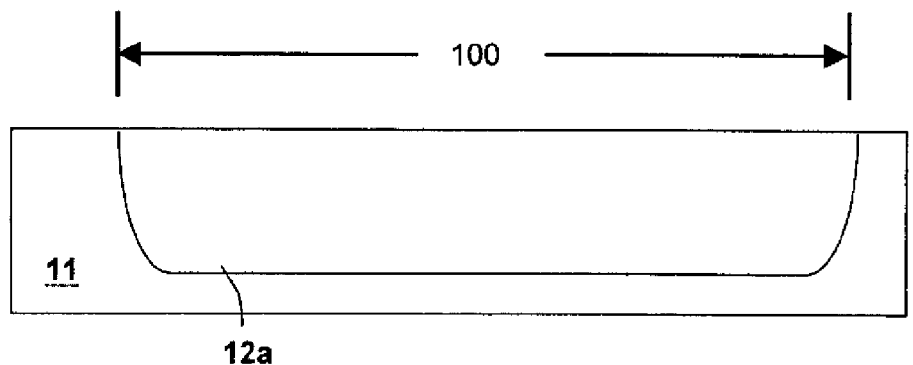
FIGS. 2A-2F illustrate the first embodiment of the present invention by cross-section views.
Figure 2B:
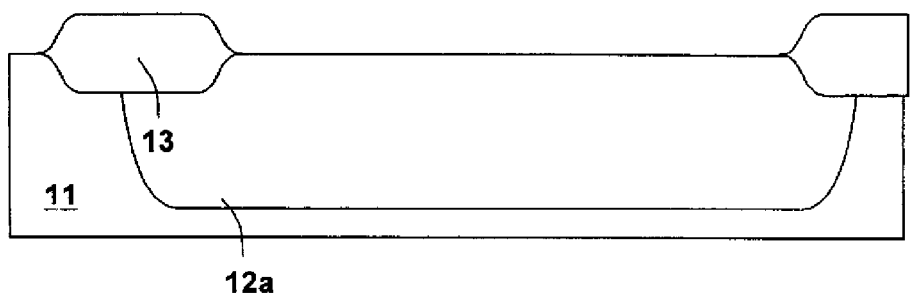
Figure 2C:
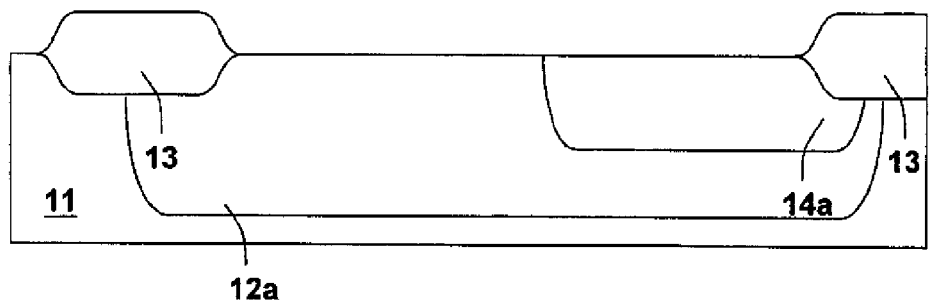

Please refer to the cross-section views of FIGS. 2A-2F, which show a first embodiment of the present invention. This embodiment illustrates the structure of an N-type HVMOS device and a method for making it. First, as shown in FIG. 2A, a substrate 11 is provided; a P-type well 12a is formed in the substrate 11 by lithography and implantation, wherein the P-type well 12a defines a device region 100. Next, as shown in FIG. 2B, an isolation region 13 is formed in the substrate 11, for example by local oxidation of silicon (LOCOS) or shallow trench isolation (STI) technology. In the next step, as shown in FIG. 2C, an N-type first drift region 14a is formed in the P-type well 12a by lithography and implantation.

Figure 2D:
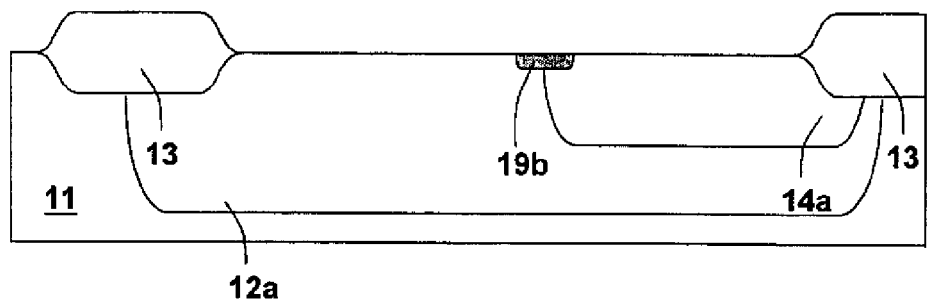

In the next step, as shown in FIG. 2D, a first P-type dopant region 19b is formed by lithography and implantation of P-type impurities; the first P-type dopant region 19b covers a part of the junction of the P-type well 12a and the N-type first drift region 14a. The first P-type dopant region 19b is helpful to enhance the breakdown voltage of the N-type HVMOS device, but does not deteriorate its ON resistance. Furthermore, the step of forming the first P-type dopant region 19b can be integrated with a typical ion implantation step for adjusting the device threshold voltage (the Vt implant step); in other words, the present invention can be conveniently achieved by simply modifying the mask layout for Vt implant, without adding any extra mask or extra process step. More specifically, in the prior art Vt implant step, the whole device region is exposed to ion implantation; in the present invention, only the junction of the P-type well 12a and the N-type first drift region 14a is exposed to ion implantation. Referring to FIG. 2F in conjunction with FIG. 2D, from cross-section view, the exposed area for implantation has two ends, one end of which extends at most to the middle of the drain 18a, and the other end of which extends at least partially underneath the gate structure. The maximum exposed area is as shown by the dash line in FIG. 2F. The implantation of P-type impurities is preferably performed according to parameters of: an acceleration energy from 10,000 electron volts to 200,000 electron volts; an implantation species containing boron or indium ions; and an implantation dosage from 1E12 to 1E14 ions per centimeter square. This step enhances the breakdown voltage of the N-type HVMOS device without sacrificing its ON resistance, without adding any extra mask or extra process step, or changing any other process parameter (for example, the thermal budget). This is one advantage of the present invention over the prior art.

Figure 2E:
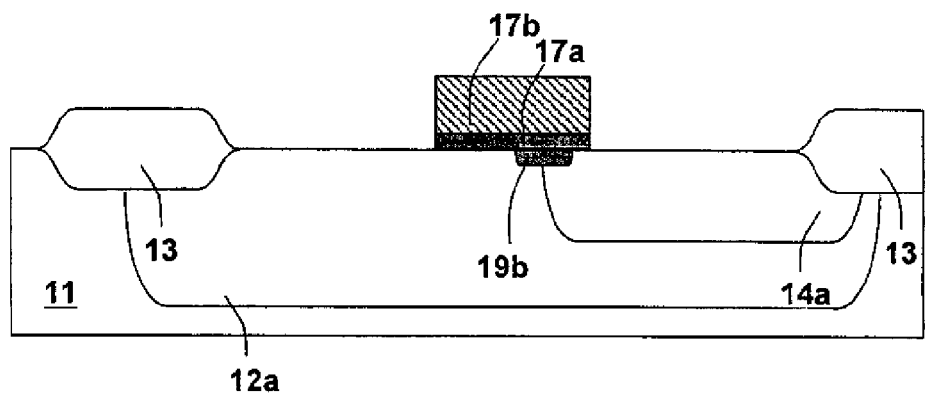
Figure 2F:
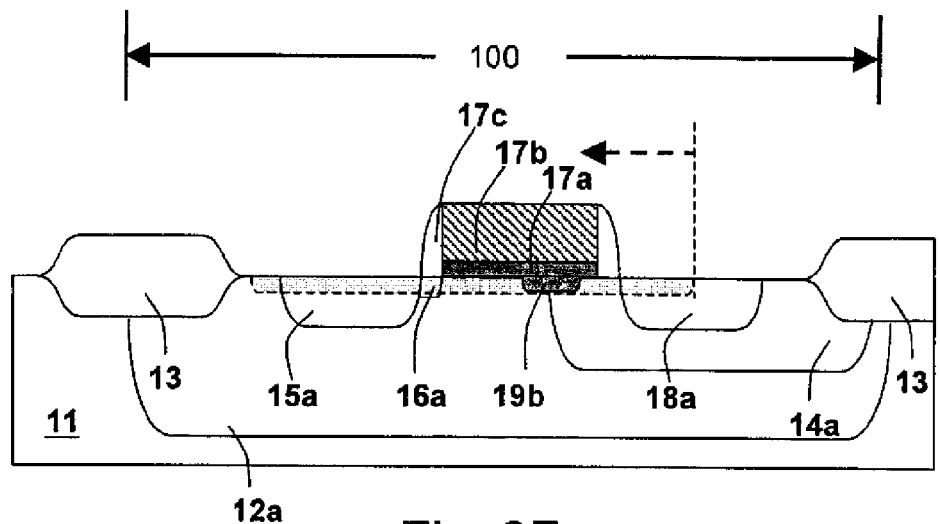

Next, as shown in FIG. 2E, part of the gate structure 17, which includes a gate dielectric layer 17a and a gate conductive layer 17b, is formed on the substrate 11. FIG. 2F shows that an N-type lightly doped region 16a, a gate spacer 17c (which is a part of the gate structure) on the sidewall of the gate, an N-type source 15a, and an N-type drain 18a are formed by self-align, lithography, etch, and ion implantation processes. The N-type lightly doped region 16a partially overlaps with the N-type source 15a, and extends partially beneath the gate structure 17.

Figure 3:
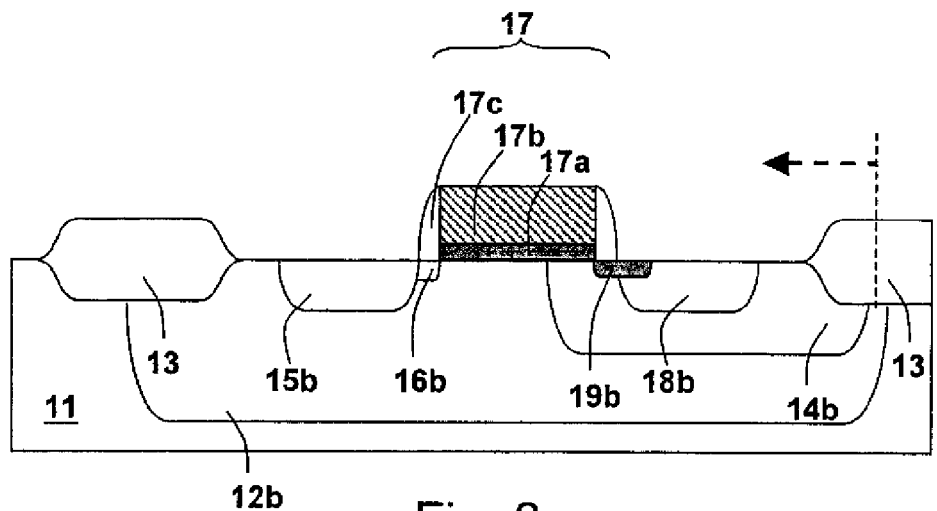
FIGS. 3-5 illustrate cross-section views of three other embodiments of the present invention.

FIG. 3 illustrates a second embodiment of the present invention, which is a P-type HVMOS device. This embodiment is different from the first embodiment of the present invention in that, other than the N-type well 12b, the first P-type drift region 14b, the P-type source 15b, the P-type drain 18b, and the P-type lightly doped region 16b, the first P-type doped region 19b is defined to cover a part of the junction of the P-type drain 18b and the P-type first drift region 14b, wherein the first P-type dopant region 19b has two ends from cross-section view, one end of which extends at most to the junction of the N-type well 12b and the first P-type drift region 15b, and the other end of which has no limitation (as illustrated by the dash line and the arrow in the figure). Preferred parameters for implantation are: an acceleration energy from 10,000 electron volts to 200,000 electron volts; an implantation species containing boron or indium ions; and an implantation dosage from 1E12 to 1E14 ions per centimeter square. This step reduces the ON resistance of the P-type HVMOS device without sacrificing its breakdown voltage. Similarly, the step of forming the first P-type dopant region 19b can be integrated with the Vt implant step; the effect of the present invention can be achieved by just modifying the layout of the mask for Vt implant.

Figure 4:
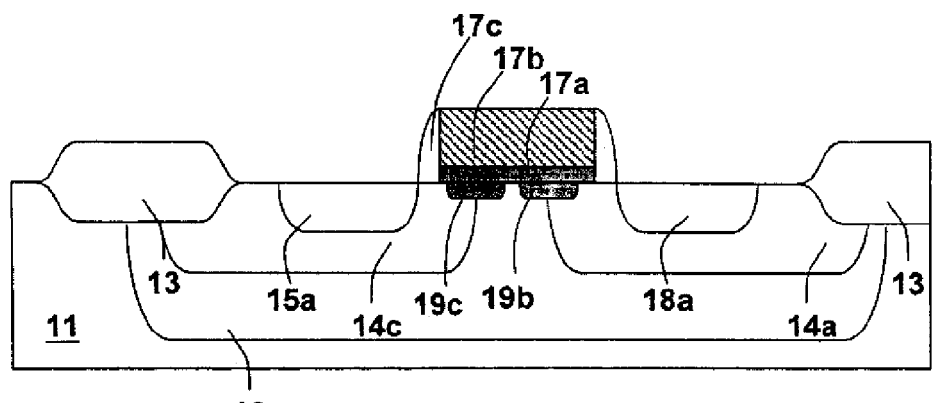

The aforementioned embodiments are asymmetric devices. FIG. 4 shows another embodiment of the present invention, which is a symmetric N-type HVMOS device. This embodiment is different from the first embodiment in that, there is no N-type lightly doped region 16a in the P-type well 12a, but a second N-type drift region 14c is added to separate the N-type source 15a from the gate structure 17 such that the voltage applicable on the source 15a is increased, and a second P-type dopant region 19c is added to cover a part of the junction of the P-type well 12a and the second N-type drift region 14c. The second P-type dopant region 19c is formed by implanting P-type impurities for enhancing the breakdown voltage of the N-type HVMOS device. Similarly, from cross-section view, one end of the second P-type dopant region 19c extends at most to the middle of the source 15a, and the other end extends at least partially underneath the gate structure.

Figure 5:
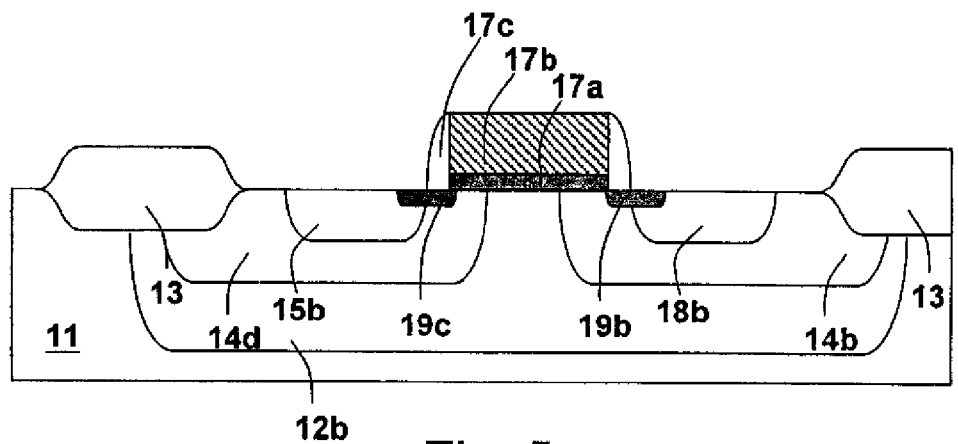

FIG. 5 shows another embodiment of the present invention, which is a symmetric P-type HVMOS device. This embodiment is different from the second embodiment in that, there is no P-type lightly doped region 16b in the N-type well 12b, but a P-type second drift region 14d is added to separate the P-type source 15b from the gate structure 17, and a second P-type dopant region 19c is added to cover apart of the junction of the P-type source 15b and the second P-type drift region 14d. The second P-type dopant region 19c is formed by implanting P-type impurities for further reducing the ON resistance of the P-type HVMOS device.

Figure 6:
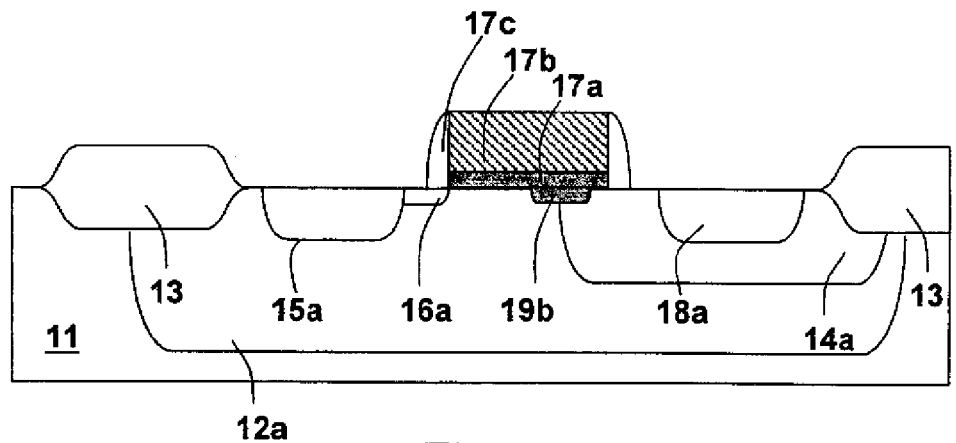
FIGS. 6-7 illustrate cross-section views of two other embodiments of the present invention, wherein the drains 18a and 18b are not formed by a self-aligned process.
Figure 7:
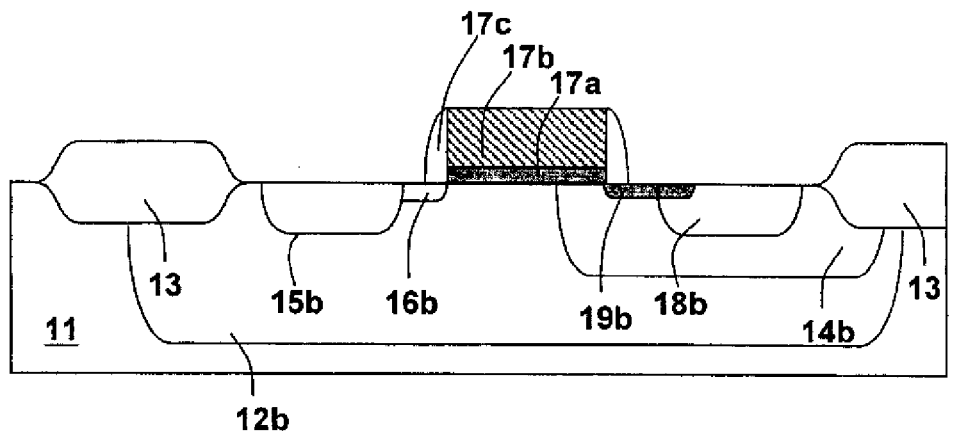

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography technology is not limited to photolithography technology by a photo mask; it can include electron beam lithography technology. As yet another example, in FIGS. 1-5, the drains 18a/18b are aligned with the gate spacer 17c, and this implies that a self-aligned process is used to form the drains 18a/18b by ion implantations masked with the gate structure 17. However, the present invention is not limited to this; the drains 18a/18b can be formed not by the self-aligned process, as shown by the embodiments of FIGS. 6 and 7. In view of the foregoing, the spirit of the present invention should cover all such and other modifications and variations, which should be interpreted to fall within the scope of the following claims and their equivalents.

What is claimed is:

1. A high voltage metal oxide semiconductor (HVMOS) device comprising:
    a substrate;
    a gate structure on the substrate;
    a P-type well in the substrate, which defines a device region from top view;
    a first N-type drift region in the P-type well;
    an N-type source in the P-type well;
    an N-type drain in the first N-type drift region, the N-type drain being separated from the gate structure by a part of the first N-type drift region, wherein from a cross-section view, the first N-type drift region extends wider from both sides of the N-type drain; and
    a first P-type dopant region covering a part of a junction of the P-type well and the first N-type drift region but not covering all the device region for enhanceing a breakdown voltage of the HVMOS device, the first P-type dopant region being formed by implanting a P-type dopant, wherein the first P-type dopant region has a depth not deeper than a depth of the N-type drain and wherein the first P-type dopant region has two ends in a lateral direction, one end of which extends at most to the middle of the N-type drain, and the other end of which extends partially underneath a gate conductive layer of the gate structure, wherein the part of the first P-type dopant region extending underneath the gate structure is in direct contact with the gate structure;
    wherein the junction of the P-type well and the first N-type type drift region is an outer periphery of the first N-type drift region, and the junction passes through the first P-type dopant region.

2. The HVMOS device of claim 1, wherein the HVMOS device is an asymmetric device which further comprises:
    an N-type lightly doped region partially overlapping with the N-type source and partially underneath the gate structure.

3. The HVMOS device of claim 1, wherein the HVMOS is a symmetric device which further comprises:
    a second N-type drift region in the P-type well for separating the N-type source from the gate structure; and
    a second P-type dopant region covering a part of a junction of the P-type well and the second N-type drift region but not covering all the device region, wherein the second P-type dopant region has two ends from cross-section view, one end of which extends at most to the middle of the N-type source, and the other end of which extends at least partially underneath the gate structure.

* * * * *